United States Patent [19]
Yamaguchi

[11] Patent Number: 6,150,887
[45] Date of Patent: Nov. 21, 2000

[54] PLL CIRCUIT IN WHICH OUTPUT OSCILLATION SIGNAL FREQUENCY CAN BE CONTROLLED BASED ON BIAS SIGNAL

[75] Inventor: Motoi Yamaguchi, Tokyo, Japan

[73] Assignee: NEC Corporation, Tokyo, Japan

[21] Appl. No.: 08/925,405

[22] Filed: Sep. 8, 1997

[30] Foreign Application Priority Data

Sep. 10, 1996 [JP] Japan ................................. 8-238905

[51] Int. Cl.[7] .............................. H03L 7/08; H03L 7/22; H03L 7/23
[52] U.S. Cl. .................................. 331/11; 331/2; 331/16; 331/17; 331/177 R; 327/156; 375/376
[58] Field of Search .................................. 331/11, 17, 2, 331/177 R, 16; 327/156; 375/376

[56] References Cited

U.S. PATENT DOCUMENTS

| | | | |
|---|---|---|---|
| 5,072,195 | 12/1991 | Graham et al. | 331/2 |
| 5,334,953 | 8/1994 | Mijuskovic | 331/8 |
| 5,629,650 | 5/1997 | Gersbach et al. | 331/17 |

FOREIGN PATENT DOCUMENTS

| | | |
|---|---|---|
| 58-140822 | 8/1983 | Japan . |
| 61-144125 | 7/1986 | Japan . |
| 61-281623 | 12/1986 | Japan . |
| 62-164651 | 10/1987 | Japan . |
| 62-296623 | 12/1987 | Japan . |
| 4-1527 | 1/1992 | Japan . |
| 6-77736 | 3/1994 | Japan . |
| 6-152401 | 5/1994 | Japan . |
| 7-7328 | 1/1995 | Japan . |
| 8-139597 | 5/1996 | Japan . |

*Primary Examiner*—Arnold Kinkead

[57] ABSTRACT

In a phase locked loop (PLL) circuit, a phase comparator compares an input signal and a feed back signal in phase to generate a phase difference voltage signal. A loop filter filters the phase difference voltage signal, and generates a filter output voltage signal. A bias signal generating section automatically generates a bias signal. A voltage controlled oscillating section generates an oscillation output signal based on the filter output voltage signal and the bias signal. The voltage controlled oscillating section generates the oscillation output signal having a same frequency as that of the input signal based on the bias signal. A counter generates the feed back signal based on the oscillation output signal.

17 Claims, 3 Drawing Sheets

PLL CIRCUIT IN WHICH OUTPUT OSCILLATION SIGNAL FREQUENCY CAN BE CONTROLLED BASED ON BIAS SIGNAL

BACKGROUND OF THE INVENTION

1. Field of the Invention

The present invention relates to a phase-locked loop (PLL) circuit. More particularly, the present invention relates to a PLL circuit in which an output oscillation signal frequency can be controlled based on a bias signal.

2. Description of the Related Art

In general, phase-cocked loop (PLL) circuits are used in various electronic circuits, for example, communication networks. A typical PLL circuit is schematically represented in FIG. 1. This PLL circuit includes a phase comparator 101, a loop filter 102, and a voltage-controlled oscillator (VCO) 103. The phase comparator 101 compares a phase of an input signal Vin with a phase of an output oscillation signal Vosc from the voltage-controlled oscillator 103 to thereby generate a signal corresponding to this phase difference, namely, an error voltage signal Ve. In response to tile error voltage signal Ve, the loop filter 102 generates a control voltage signal Vctr and then applies this control voltage signal to the voltage-controlled oscillator 103. Based on this control voltage signal Vctr, the voltage-controlled oscillator 103 controls a frequency Fosc of the output oscillation signal Vosc. The entire loop constitutes a negative feed-back loop. Thus, this PLL circuit is operable in such a manner that the phase of the output oscillation signal Vosc from the voltage-controlled oscillator 103 is approximated to the phase of the input signal Vin. Accordingly, the output oscillation signal Vosc from the voltage-controlled oscillator 103 is finally synchronized in phase and frequency with the input signal Vin.

FIG. 2 shows a control voltage-oscillation frequency characteristic of the voltage-controlled-oscillator 103. Referring to FIG. 2, in such a case that the control voltage to oscillation frequency characteristic is shown by a characteristic line 50 and also the control voltage Vctr is in a range 50b, frequencies possibly outputted from the voltage-controlled oscillator 103 are in another range 50a. In other words, a frequency range of the input signal Vin in which synchronization can be established in the PLL circuit shown in FIG. 1 is in the range 50a.

Assuming now that an output voltage, namely, the control voltage Vctr from the loop filter 102 when the input signal Vin is not supplied is Vc, a free-running oscillation signal frequency of the voltage-controlled oscillator 103 becomes "Fc0". The free-running oscillation signal frequency Fc of the voltage-controlled oscillator 103 is preferably approximated to the frequency Fin of the input signal Vin. When the frequency Fin of the input signal Vin is preset, it is so designed that the free-running oscillation signal frequency Fc is this preset frequency.

In the above-described PLL circuit shown in FIG. 1, since the characteristic of the voltage-controlled oscillator 103 may be exclusively determined, the frequency range synchronizable with the input signal Vin, e.g., the range 50a in FIG. 2 is necessarily limited. As a consequence, the voltage-controlled oscillator 103 needs be re-designed every time the frequency Fin of the input signal Vin to be synchronized is changed.

Also, there is a case where the characteristics of the voltage-controlled oscillator 103, for example, free-running oscillation frequency Fc and synchronizable frequency range are shifted from the designed values thereof due to fluctuations in the manufacturing processes and/or changes in ambient temperatures of the PLL circuit. In this case, the difference between the free-running oscillation signal frequency Fc and the frequency of the input signal Vin becomes large apart from the designed value. As a result, the time period required until the PLL circuit is synchronized or stabilized would be prolonged, and/or the optimum value of the loop filter would be varied. In the worst case, the frequency of the input signal Vin is out of the synchronizable frequency range of the voltage-controlled oscillator 103, and therefore the synchronization of the PLL circuit can be no longer established.

Referring again to FIG. 2, when the designed value of the control voltage-oscillation frequency characteristic of the voltage-controlled oscillator 103 is shown by a characteristic line 50, the control voltage Vctr is in the range 50b. In this case, the possible oscillation frequency of the voltage-controlled oscillator 103 is in the range 50a, and the free-running oscillation frequency is Fc0. On the other hand, there is a case where the control voltage-oscillation frequency characteristic of the voltage-controlled oscillator 103 is changed due to the manufacturing process variations and the ambient temperature changes. In such a case, when the control voltage-oscillation frequency characteristic of the voltage-controlled oscillator 103 is shifted to be shown by another characteristic line 51, the oscillation frequency is in the range 51a and the free-running oscillation frequency is Fc1. Similarly, when the control voltage-oscillation frequency characteristic of the voltage-controlled oscillator 103 is shifted to be shown by another characteristic line 52, the oscillation frequency is in the range 52a and the free-running oscillation frequency is Fc2.

In this manner, in the conventional PLL circuit, in order to increase the operation reliability thereof, the oscillation signal frequency range of the voltage-controlled oscillator needs be widened based on previous estimation of the manufacturing process fluctuations and the ambient temperature changes during the operation of this PLL circuit. As one conventional range widening method, the gain of the voltage-controlled oscillator is increased, so that the synchronizable frequency range of the input signal to the PLL circuit can be widened. However, this conventional range widening method owns such a problem that the PLL circuit would become sensible to noise and thus jitter would be increased.

On the other hand, when the gain of the voltage-controlled oscillator is increased, the fluctuations in the differences between the free-running oscillation signal frequency Fc and the frequency Fin of the input signal Vin would be increased due to the manufacturing process fluctuations. For this reason, there is a problem in that the optimum values of the loop filters would be greatly changed, depending upon the PLL circuits. As a consequence, the loop filters must be adjusted, depending upon the PLL circuits.

To avoid the above-explained problems, in the PLL circuits disclosed in Japanese Laid Open Patent Disclosure (JP-A-Showa 58-140822) and Japanese Examined Patent Disclosure (JP-B2-Heisei 4-001527), the center frequency, i.e., a free-running oscillation frequency of the voltage-controlled oscillator is fixed by use of a bias current. Also, the gain of the voltage-controlled oscillator is made variable, so that the synchronizable frequency range of the PLL circuit can be widened.

Furthermore, in the PLL circuits disclosed in Japanese Laid Open Patent Disclosure (JP-A-Showa 61-144125 and JP-A-Heisei 6-152401), an adjustment time period is proposed such that the gain of the voltage-controlled oscillator and the free-running oscillation frequency Fc can be set to the designed values or externally inputted values, irrelevant to the manufacturing process fluctuations.

However, the above-described PLL circuits own the following problems. That is, in the former PLL circuits described in JP-A-Showa 58-140822 and JP-A-Heisei 4-001527, the bias current for determining the free-running oscillation frequency is generated by use of resistive elements and transistors. Therefore, when the parameters such as threshold values of transistors and resistance values due to change of manufacturing process parameters are shifted from the designed parameter values, the free-running oscillation frequency Fc and the synchronizable frequency range of the PLL circuit would be shifted from the designed values. In the worst case, there is a risk that the synchronization of these conventional PLL circuits can be no longer established.

Also, in the latter PLL circuits described in JP-A-Showa 61-144125 and JP-A-Heisei 6-152401, adjusting circuits such as a counter and a D/A converter are increased in circuit scale so as to widen the adjustable frequency range and increase the resolution. Accordingly, the overhead of these circuits is not negligible. Also, there is another problem that since the PLL circuits are adjusted in the first stage, the characteristic changes caused by the ambient temperature changes during the circuit operations could not be adjusted.

SUMMARY OF THE INVENTION

The present invention has been made to solve the above-described problems, and therefore, has an object to provide a highly reliable PLL circuit capable of automatically compensating for changes in circuit characteristics caused by changes in a manufacturing process and also temperature changes occurred while this PLL circuit is operated.

In order to achieve an aspect of the present invention, a phase locked loop (PLL) circuit includes a first phase comparator for comparing an input signal and a first feed back signal in phase to generate a first phase difference voltage signal, a first loop filter for filtering the first phase difference voltage signal, and for generating a first filter output voltage signal, a bias signal generating section for generating a bias signal, a first voltage controlled oscillating section for generating a first oscillation output signal based on the first filter output voltage signal and the bias signal, the voltage controlled oscillating section generating the first oscillation output signal having a same frequency as that of the input signal based on the bias signal, and a first counter for generating the first feed back signal based on the first oscillation output signal.

When the first voltage controlled oscillating section includes an oscillator for outputting the oscillation output signal, the bias signal generating section includes a replica of the oscillator. Thereby, the oscillator and the replica of the oscillator receive same influence of temperature and same influence in manufacturing processes. Also, the bias signal generating section generates the bias signal based on a reference input signal which is associated with the input signal in frequency.

The bias signal generating section may include a second phase comparator for comparing a reference input signal and a second feed back signal in phase to generate a second phase difference voltage signal, a second loop filter for filtering the second phase difference voltage signal, and for generating a second filtered output voltage signal, a second voltage controlled oscillating section for generating a second oscillation output signal and the bias signal based on the second filtered output voltage signal, and a second counter for generating the second feed back signal based on the second oscillation output signal.

The first and second oscillation output signals desirably have a same frequency. In this case, the first counter frequency-divides the first oscillation output signal with a ratio of 1/M (M is a positive number), and the second counter frequency-divides the second oscillation output signal with a ratio of 1/N (N is a positive number). The reference input signal can have a frequency of (N/M) times of that of the input signal.

Also, the first and second filters are low pass filters, and a cut-off frequency of the first filter is desirably lower than that of the second filter. In this case, the first voltage controlled oscillating section have a gain larger than that of the second voltage controlled oscillating section. The first voltage controlled oscillating section includes a first voltage/current converter for converting the first filtered output voltage signal into a first phase error current signal, an adder for adding the first phase error current signal and the bias signal to generate a control signal, and a first current controlled oscillator for generating the first oscillation output signal based on the control signal. Also, the second voltage controlled oscillating section includes a second voltage/current converter for converting the second filtered output voltage signal into a second phase error current signal and the bias signal and for supplying the bias signal to the adder, and a second current controlled oscillator for generating the second oscillation output signal based on the second phase error current signal. In this case, the first and second current controlled oscillators have a same gain, and wherein the second voltage/current converter converts the second filtered output voltage signal into the first phase error current signal and the bias signal with a conversion efficiency higher than that of the first voltage/current converter when the first voltage/current converter converts the first filtered output voltage signal into the first phase error current signal.

In order to achieve another aspect of the present invention, a phase locked loop (PLL) circuit includes a bias signal generating section for generating a bias signal, which includes a first phase comparator for comparing a reference input signal and a first feed back signal in phase to generate a first phase difference voltage signal, a first loop filter for filtering the first phase difference voltage signal to pass a component of a first frequency range, and for generating a first filtered output voltage signal, a first voltage controlled oscillating section for generating a first oscillation output signal and the bias signal based on the first filtered output voltage signal, and a first counter for generating the first feed back signal based on the first oscillation output signal. The PLL circuit further includes a second phase comparator for comparing an input signal and a second feed back signal in phase to generate a first phase difference voltage signal, a second loop filter for filtering the second phase difference voltage signal to pass a component of a first frequency range, and for generating a first filtered output voltage signal, a second voltage controlled oscillating section for generating a second oscillation output signal based on the second filtered output voltage signal and the bias signal, and a second counter for generating the second feed back signal based on the second oscillation output signal.

DETAILED DESCRIPTION OF THE PREFERRED EMBODIMENTS

Figure 1:
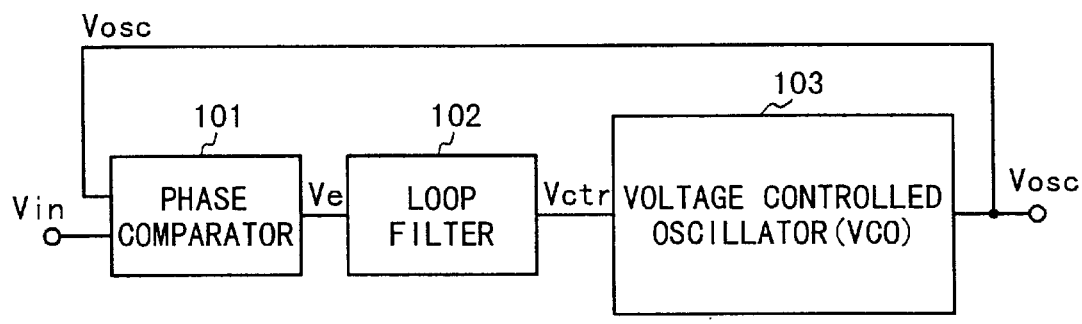
FIG. 1 is a schematic block diagram illustrating the structure of a conventional PLL circuit.
Figure 2:
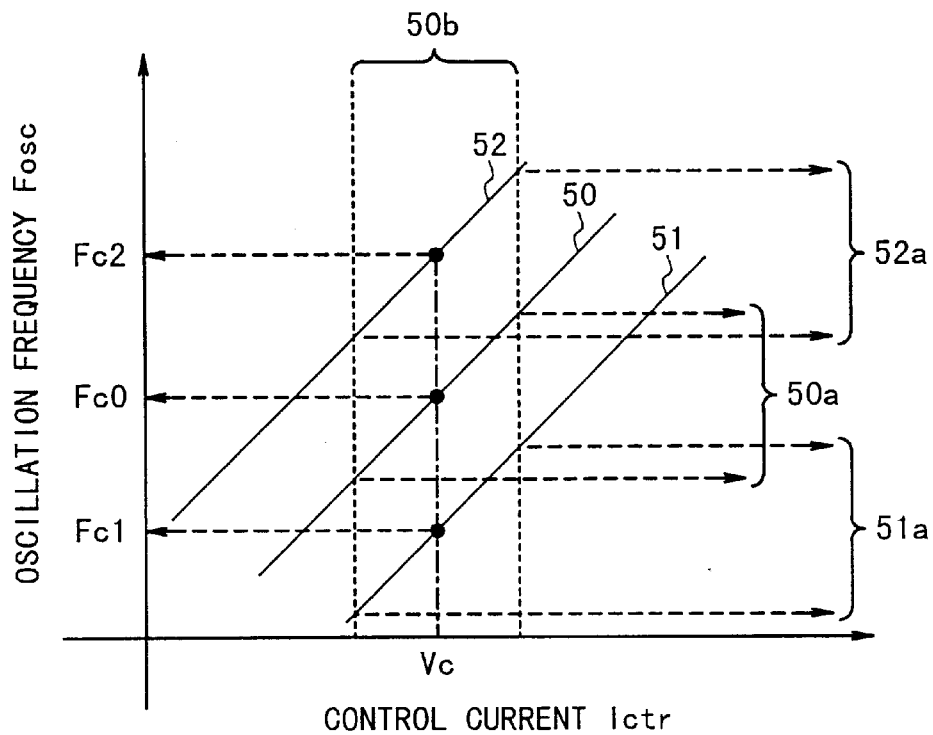
FIG. 2 is a graph illustrating the control voltage-oscillation frequency characteristic of a voltage-controlled oscillator employed in the PLL circuit of FIG. 1.
Figure 3:
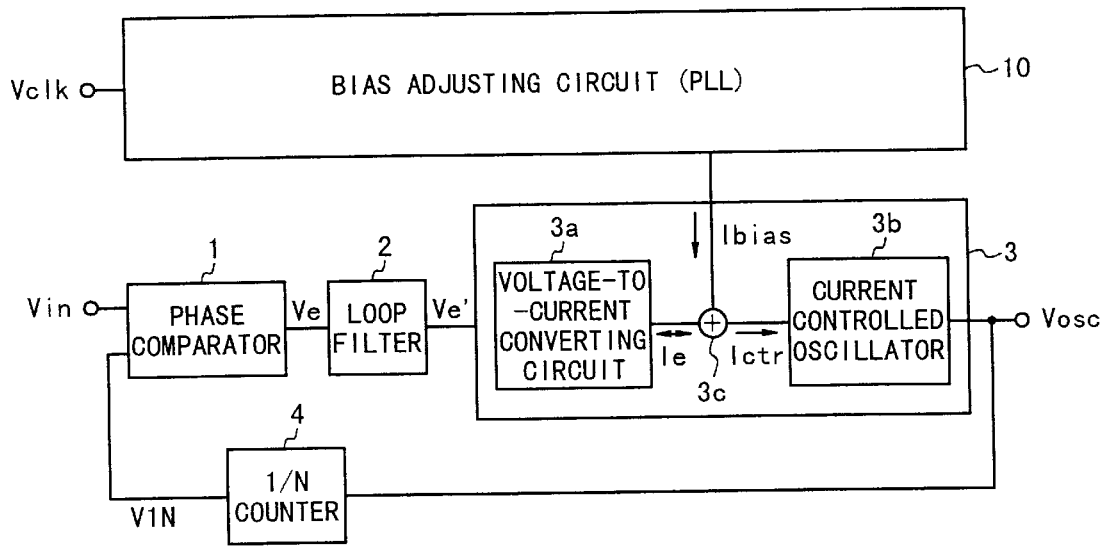
FIG. 3 is a schematic block diagram illustrating the structure of a PLL circuit according to an embodiment of the present invention.

A phase-locked loop (PLL) circuit according to an embodiment of the present invention will be described in detail with reference to the accompanying drawings. FIG. 3 is a schematic block diagram illustrating the structure of the PLL circuit according to the embodiment of the present invention.

Referring now to FIG. 3, this PLL circuit is constituted by a phase comparator 1, a loop filter 2, a voltage-controlled oscillator 3, a 1/N-counter 4, and a bias adjusting circuit 10. The phase comparator 1 compares a phase of an input signal Vin with a phase of a feedback signal V1N to generate a voltage signal corresponding to this phase difference, namely a phase difference voltage signal Ve. Thus, this phase comparator 1 supplies the phase difference voltage signal Ve to the loop filter 2. The loop filter 2 is a low pass filter, and filters out a high frequency component contained in the phase difference voltage signal Ve to derive a filtered output voltage signal Ve'. The loop filter 2 supplies the filtered output voltage signal Ve' to the voltage-controlled oscillator 3. The voltage-controlled oscillator 3 receives a bias current signal Ibias from the bias adjusting circuit 10. The voltage-controlled oscillator 3 generates an output oscillation signal Vosc based on the filtered output voltage signal Ve' and the bias current signal Ibias. The 1/N-counter 4 frequency-divides the output oscillation signal Vosc from the voltage-controlled oscillator 3 with a frequency division ratio of "N". That is, the voltage-controlled oscillator 3 is controlled in such a manner that the phase of the feedback signal V1N as the output signal of the counter 4 is coincident with the phase of the input signal. In a case that the feedback signal V1N is synchronized with the input signal Vin, the voltage-controlled oscillator 3 outputs the output oscillation signal Vosc having a frequency N times higher than that of the input signal Vin. The bias adjusting circuit 10 is employed so as to generate the bias current Ibias in response to a reference input signal Vclk, to be explained later in detail.

The voltage-controlled oscillator 3 includes a voltage/current converting circuit 3a, a current-controlled oscillator 3b, and an adder 3c. The voltage/current converting circuit 3a converts the filter output voltage Ve' from the loop filter 2 into a phase error current Ie. The adder 3c adds the phase error current Ie to the bias current Ibias to thereby generate a control current Ictr. The current-controlled oscillator 3b generates the oscillation output oscillation signal Vosc in response to the control circuit Ictr.

When no input signal Vin is supplied, or no phase difference exists between the input signal Vin and the feedback signal V1N, this phase error current Ie becomes zero. At this time, the current-controlled oscillator 3b is oscillated based on only the bias current Ibias. That is, the frequency Fc of a free-running oscillation signal from the current-controlled oscillator 3b is determined based on the bias current Ibias. This bias current Ibias is automatically adjusted by the bias adjusting circuit 10 in such a manner that the free-running oscillation signal frequency Fc may be set to an arbitrary frequency, namely, a frequency Fin of the input signal Vin.

When the input signal Vin is entered, the phase of the input signal Vin is compared with the phase of the feedback signal V1N by the phase comparator 1. Then, the phase error current Ie is changed based on the comparing result of the phase comparator 1 to control the current-controlled oscillator 3b. Finally, the feedback signal V1N may be synchronized with the input signal Vin.

Figure 5:
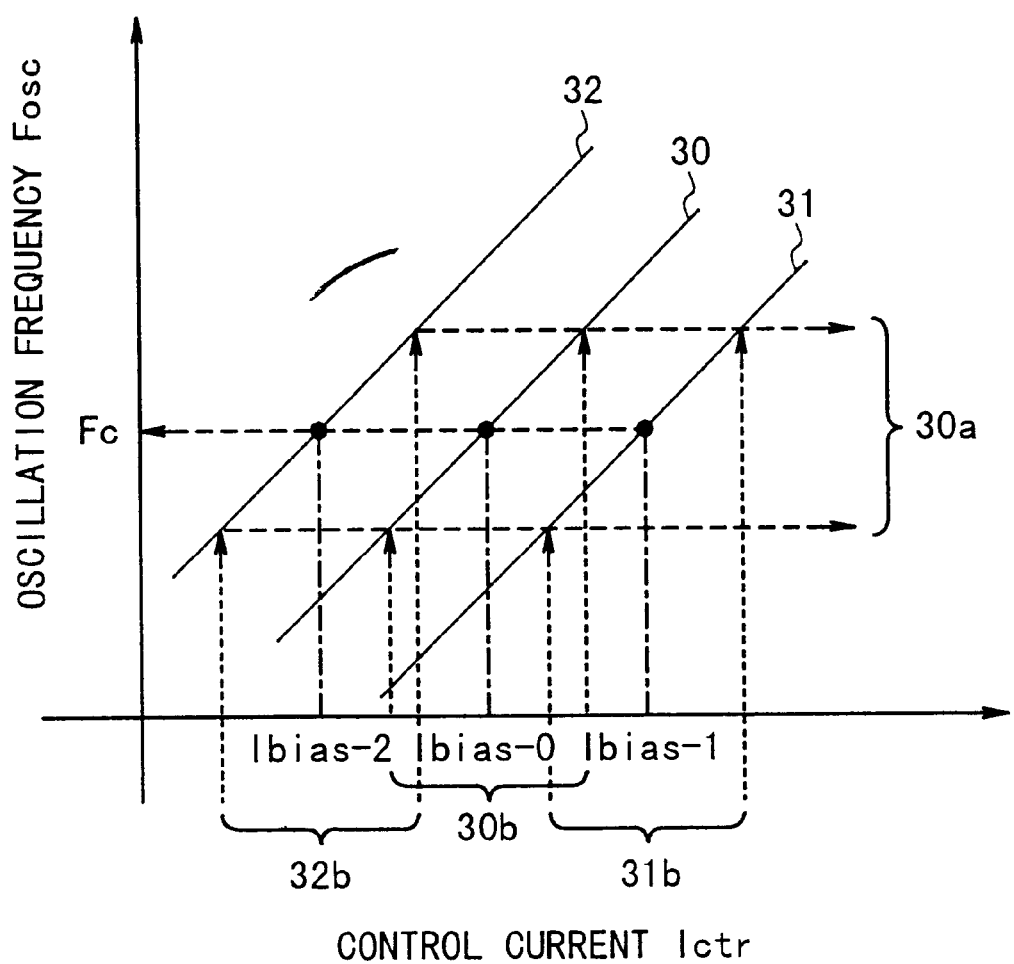
FIG. 5 is a graph illustrating an ideal control current-oscillation frequency characteristic of a current-controlled oscillator employed in the PLL circuit of FIG. 3.

In FIG. 5, there is a graph illustrating a control current-oscillation frequency characteristic of the current-controlled oscillator 3b. As shown in FIG. 5, there is a case that the characteristic of the current-controlled oscillator 3b is shifted from the designed characteristic which is indicated by reference numeral 30 of FIG. 5 due to the manufacturing process fluctuations and the ambient temperature changes. In this case, the bias current Ibias is automatically adjusted in the PLL circuit of FIG. 3, so that both of the free-running frequency Fc and the oscillation frequency range 30a can be kept constant.

Figure 4:
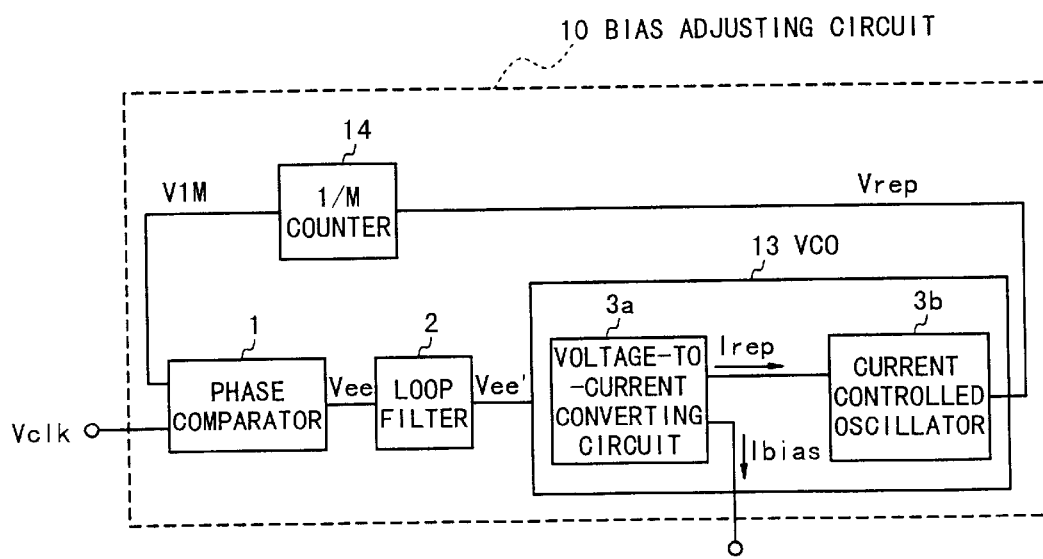
FIG. 4 is a schematic block diagram illustrating the structure of a bias adjusting circuit employed in the PLL circuit of FIG. 3.

An internal circuit structure of the bias adjusting circuit 10 is shown in FIG. 4. This bias adjusting circuit 10 constitutes another PLL circuit that a reference clock signal Vclk is received as an input signal. The bias adjusting circuit 10 includes a phase comparator 11, a loop filter 12, a voltage-controlled oscillator 13, and a 1/M-counter 14. The phase comparator 11 compares a phase of the reference clock signal Vclk with a phase of a signal V1M generated by frequency-dividing an output oscillation signal Vrep from the voltage-controlled oscillator 13 by the 1/M-counter 14 by the frequency division ratio of "M". Thus, this phase comparator 11 generates a signal corresponding to this phase difference, namely a phase difference voltage signal Vee, and supplies the phase difference voltage signal Vee to the loop filter 12. The loop filter 12 filters out a high frequency component contained in the phase difference voltage signal Vee to derive a filtered output voltage signal Vee', and supplies the filtered output voltage signal Vee' to the voltage-controlled oscillator 13. The voltage-controlled oscillator 13 is controlled in such a manner that a phase of the feedback signal ViM is coincident with the phase of the reference signal Vclk. In such a case that the feedback signal ViM is synchronized with the reference signal Vclk, the voltage-controlled oscillator 13 outputs the output oscillation signal Vrep having a frequency M times higher than that of the reference clock signal Vclk.

The voltage-controlled oscillator 13 contains a voltage/current converting circuit 13a, and a replica oscillator 13b made of a replica for the current-controlled oscillator 3b. The voltage/current converting circuit 13a converts the filtered output voltage signal Vee' from the loop filter 12 into a current form, so that a control current Irep is outputted. When the above-described bias adjusting circuit 10 as a PLL circuit can be operated under stable state in the well-known operation manner, the feedback signal ViM form the 1/M-counter 14 is synchronized with the reference clock signal Vclk. At this time, the replica oscillator 13b of the voltage-controlled oscillator 13 oscillates at a frequency M times higher than that of the reference signal Vclk. The control current Irep has a value required to cause the replica oscillator 13b to oscillate at the frequency M times higher than that of the reference signal Vclk. As a consequence, the bias adjusting circuit 10 may output the bias current Ibias having a current value equal to that of the control current Irep. In other words, this bias adjusting circuit 10 may be operated as a bias current generating section.

It is now assumed that the replica oscillator 13b and the oscillator 3b are formed on the same semiconductor chip with the same design size and the same manufacturing processes. Therefore, the replica oscillator 13b and the oscillator 3b receive the same influence in the manufacturing processes and the same influence of ambient temperature. As a result, the replica oscillator 13b has the same circuit structure as well as the same electric characteristic as those of the current-controlled oscillator 3b. When the replica oscillator 13b oscillates at a certain frequency Frep, the free-running oscillation signal frequency of the current-controlled oscillator 3b becomes the frequency Frep, if a current equal to this control current Irep is supplied to the current-controlled oscillator 3b as the bias current Ibias. That is to say, the free-running oscillation signal frequency of the current-controlled oscillator 3b can be arbitrarily determined by varying the oscillation signal frequency Frep of the replica oscillator 13b. The oscillation signal frequency Frep of the replica oscillator 13b is variable in response to the reference signal Vclk.

Assuming now that the frequency of the input signal Vin is Fin, and the frequency of the reference signal is Fclk, the oscillation signal frequency of the replica oscillator 13b, namely the free-running oscillation signal frequency Fc of the current-controlled oscillator 3b is expressed by the following equation (1):

$$Fc = M \cdot Fclk = N \cdot Fin \qquad (1)$$

When the above-described equation (1) is modified, it is given as follows:

$$Fclk = N/M \, Fin \qquad (2)$$

In order to make the free-running oscillation signal frequency Fc of the current-controlled oscillator 3b equal to Fin, it is sufficient that the reference signal having a frequency of (N/M)Fin is supplied to the bias adjusting circuit 10.

Generally speaking, a pure reference signal having no any side-band noise is desired as this reference signal Vclk. On the other hand, it is difficult to generate such a pure reference signal having a high frequency. Moreover, a reference signal generator capable of generating such a pure reference signal having a high frequency is made costly high.

On the contrary, in the PLL circuit according to the embodiment of the present, even when the frequency Fin of the input signal Vin is high, which is desirably synchronized with the feedback signal, if the ratio of N/M is decreased, then the frequency Fclk of the reference signal Vclk may be suppressed to the low frequency. As a consequence, such a costly expensive high-frequency reference signal generator is no longer required.

To achieve a high stability as a PLL circuit, it is required to have a sufficient phase margin. When the cut-off frequency of the loop filter 102 is decreased in the conventional PLL circuit such that a sufficient phase margin can be obtained, the phase difference signal between the input signal Vin and the free-running output oscillation signal could not pass through the loop filter 102. As a result, the synchronization could not be established.

In the above-described PLL circuit of the present invention shown in FIG. 3, the free-running oscillation signal frequency Fc can be automatically adjusted to be substantially equal to the input signal frequency Fin based on the bias signal Ibias from the bias adjusting circuit 10. Therefore, the phase difference signal Ve becomes a low frequency signal. Even when the cut-off frequency of the loop filter 3 is decreased so as to obtain a sufficient phase margin, there is no possibility that the synchronization cannot be established. As a consequence, the high stability can be realized in the PLL circuit according to the embodiment. Also, when the cut-off frequency of the loop filter 12 of the bias adjusting circuit 10 shown in FIG. 4 is designed to become high, the synchronization can be established over a wide frequency range at the same time.

Generally speaking, in the conventional PLL circuit, when the gain of the voltage-controlled oscillator 103 is increased, the synchronization can be established in a wide frequency range. However, there is a problem in that this conventional PLL circuit may have high sensitivities to noise so that jitter is increased.

On the contrary, in accordance with the PLL circuit of FIGS. 3 and 4, the synchronizable frequency range is determined based on the gain of the voltage-controlled oscillator 13 employed in the bias adjusting circuit 10. Also, the stability of this PLL circuit against jitter is determined based upon the gain of the voltage-controlled oscillator 3. As a consequence, when the gain of this voltage-controlled oscillator 13 is increased, and the gain of the voltage-controlled oscillator 3 is decreased, the wide synchronizable frequency range can be obtained, and at the same time, the low jitter characteristic can be achieved. It should be noted that the gains of these voltage-controlled oscillators 3 and 13 may be freely designed by changing the gains of the voltage/current converting circuits 3a and 13a, namely, the voltage-to-current converting ratio. This is because the voltage-controlled oscillators 3 and 13 are constructed by combining the voltage/current converting circuits 3a and 13a with the current-controlled oscillators 3b and 13b, respectively.

In the present invention, the manufacturing process fluctuations and the ambient temperature changes while operating the PLL circuit can be compensated. This is because the bias current signal Ibias is automatically generated by the replica oscillator such that the free-running oscillation signal frequency becomes equal to the input signal frequency. The bias current signal Ibias is supplied to the current-controlled oscillator 3b, as described above.

Also, in the present invention, the synchronizable frequency range can be widened and, at the same time, the low jitter characteristic can be achieved. This is because the synchronizable frequency range of the PLL circuit according to the present invention is determined based on the gain of the voltage-controlled oscillator 13 employed in the bias adjusting circuit 10. Also, the stability of this PLL circuit against the jitter is determined based on the gain of the voltage-controlled oscillator 3. The gains of both voltage-controlled oscillators 3 and 13 can be independently designed. Therefore, when the gain of the voltage-control oscillator 13 is increased as well as the gain of the voltage-controlled oscillator 3 is decreased, both the wide synchronizable frequency range and the low jitter characteristic can be achieved at the same time.

Further, in the present invention, even when there are such fluctuations in the manufacturing processes and also the ambient temperatures of the PLL circuit under operation, the loop filter needs not be adjusted. This is because the difference between the free-running oscillation signal frequency of the voltage-controlled oscillator and the frequency of the input signal is not increased by the bias adjusting circuit even when there are the manufacturing process fluctuations and the ambient temperature changes. Therefore, the optimum value of the loop filter is not changed.

What is claimed is:

1. A phase locked loop (PLL) circuit comprising:

a first phase comparator for comparing an input signal and a first feed back signal in phase to generate a first phase difference voltage signal;

a first loop filter for filtering said first phase difference voltage signal, and for generating a first filter output voltage signal;

a bias signal generating section for generating a bias signal;

a first voltage controlled oscillating section for generating a first oscillation output signal based on said first filter output voltage signal and said bias signal, wherein said voltage controlled oscillating section generates said first oscillation output signal having a same frequency as that of said input signal based on said bias signal; and a first counter for generating said first feed back signal based on said first oscillation output signal, and wherein said bias signal generating section includes;

a second phase comparator for comparing a reference input signal and a second feed back signal in phase to generate a second phase difference voltage signal;

a second loop filter for filtering said second phase difference voltage signal, and for generating a second filtered output voltage signal;

a second voltage controlled oscillating section for generating a second oscillation output signal and said bias signal based on said second filtered output voltage signal; and a second counter for generating said second feed back signal based on said second oscillation output signal, and wherein said first voltage controlled oscillating section includes;

a first voltage/current converter for converting said first filtered output voltage signal into a first phase error current signal;

an adder for adding said first phase error current signal and said bias signal to generate a control signal; and a first current controlled oscillator for generating said first oscillation output signal based on said control signal, and wherein said second voltage controlled oscillating section includes;

a second voltage/current converter for converting said second filtered output voltage signal into a second phase error current signal and said bias signal and for supplying said bias signal to said adder; and a second current controlled oscillator for generating said second oscillation output signal based on said second phase error current signal.

2. A PLL circuit according to claim 1, wherein said first current controlled oscillator and said second current controlled oscillator receive same influence of temperature and same influence in manufacturing processes, and change characteristics in same degrees due to the received influence.

3. A PLL circuit according to claim 1, wherein said first and second oscillation output signals have a same frequency.

4. A PLL circuit according to claim 1, wherein said first counter frequency-divides said first oscillation output signal with a ratio of 1/M (M is a positive number), and said second counter frequency-divides said second oscillation output signal with a ratio of 1/N (N is a positive number).

5. A PLL circuit according to claim 4, wherein said reference input signal has a frequency of (N/M) times of that of said input signal.

6. A PLL circuit according to claim 1, wherein said first and second loop filters are low pass filters, and a cut-off frequency of said first filter is lower than that of said second filter.

7. A PLL circuit according to claim 1, wherein said first voltage controlled oscillating section has a gain larger than that of said second voltage controlled oscillating section.

8. A PLL circuit according to claim 1, wherein said first and second current controlled oscillators have a same gain, and wherein said second voltage/current converter converts said second filtered output voltage signal into said first phase error current signal and said bias signal with a conversion efficiency higher than that of said first voltage/current converter when said first voltage/current converter converts said first filter output voltage signal into said first phase error current signal.

9. A phase locked loop (PLL) circuit comprising:

a bias signal generating section for generating a bias signal, wherein said bias signal generating section comprises:

a first phase comparator for comparing a reference input signal and a first feed back signal in phase to generate a first phase difference voltage signal, a first loop filter for filtering said first phase difference voltage signal to pass a component of a first frequency range, and for generating a first filtered output voltage signal, a first voltage controlled oscillating section for generating a first oscillation output signal and said bias signal based on said first filtered output voltage signal, and a first counter for generating said first feed back signal based on said first oscillation output signal;

a second phase comparator for comparing an input signal and a second feed back signal in phase to generate a first phase difference voltage signal;

a second loop filter for filtering said second phase difference voltage signal to pass a component of a first frequency range, and for generating a first filtered output voltage signal;

a second voltage controlled oscillating section for generating a second oscillation output signal based on said second filtered output voltage signal and said bias signal; and a second counter for generating said second feed back signal based on said second oscillation output signal, and wherein said first voltage controlled oscillating section includes;

a first voltage/current converter for converting said first filtered output voltage signal into a first phase error current signal and said bias signal and for supplying said bias signal to said second voltage controlled oscillating section; and a first current controlled oscillator for generating said first oscillation output signal based on said first phase error current signal; and wherein said second voltage controlled oscillating section includes;

a second voltage/current converter for converting said second filtered output voltage signal into a second phase error current signal;

an adder for adding said second phase error current signal and said bias signal from said first voltage/current converter to generate a control signal; and a second current controlled oscillator for generating said second oscillation output signal based on said control signal.

10. A PLL circuit according to claim 9, wherein said second voltage controlled oscillating section generates said second oscillation output signal having a same frequency as that of said input signal based on said bias signal.

11. A PLL circuit according to claim 9, wherein said first and second oscillation output signals have a same frequency.

12. A PLL circuit according to claim 11, wherein said first counter frequency-divides said first oscillation output signal with a ratio of 1/M (M is a positive number), and said second counter frequency-divides said second oscillation output signal with a ratio of 1/N (N is a positive number).

13. A PLL circuit according to claim 12, wherein said reference input signal has a frequency of (N/M) times of that of said input signal.

14. A PLL circuit according to claim 9, wherein said first and second filters are low pass filters, and a cut-off frequency of said second filter is lower than that of said first filter.

15. A PLL circuit according to claim 9, wherein said first voltage controlled oscillating section has a gain larger than that of said second voltage controlled oscillating section.

16. A PLL circuit according to claim 15, wherein said first and second current controlled oscillators have a same gain, and wherein said first voltage/current converter converts said first filtered output voltage signal into said first phase error current signal and said bias signal with a conversion efficiency higher than that of said second voltage/current converter when said second voltage/current converter converts said second filtered output voltage signal into said second phase error current signal.

17. A PLL circuit comprising:

a first phase comparator for comparing an input signal and a first feedback signal in phase to generate a first phase difference voltage signal;

a first loop filter for filtering said first phase difference voltage signal to generate a first filtered output voltage signal;

a first voltage/current converter for converting said first filtered output voltage signal into a first phase error current signal;

a bias adjusting circuit for generating a bias current signal;

a current adder for adding said first phase error current signal and said bias current signal to generate a first oscillator control current signal;

a first current controlled oscillator for oscillating based on said first oscillator control current signal to generate a first oscillator output signal; and a first frequency divider for frequency-dividing a frequency of said first oscillator output signal into 1/N (N is a positive number) to generate said first feedback signal;

wherein said bias adjusting circuit includes:

a second phase comparator for comparing a reference clock signal and a second feedback signal in phase to generate a second phase difference voltage signal;

a second loop filter for filtering said second phase difference voltage signal to generate a second filtered output voltage signal;

a second voltage/current converter for converting said second filtered output voltage signal into a second phase error current signal;

a second current controlled oscillator for oscillating based on said second oscillator control current signal to generate a second oscillator output signal; and a second frequency divider for frequency-dividing a frequency of said second oscillator output signal into 1/M (M is a positive number) to generate said second feedback signal.

* * * * *